Aug. 23, 1966 D. J. COYLE ETAL 3,268,885
ANALOG-TO-DIGITAL CONVERTER
Filed March 18, 1963 3 Sheets-Sheet 1
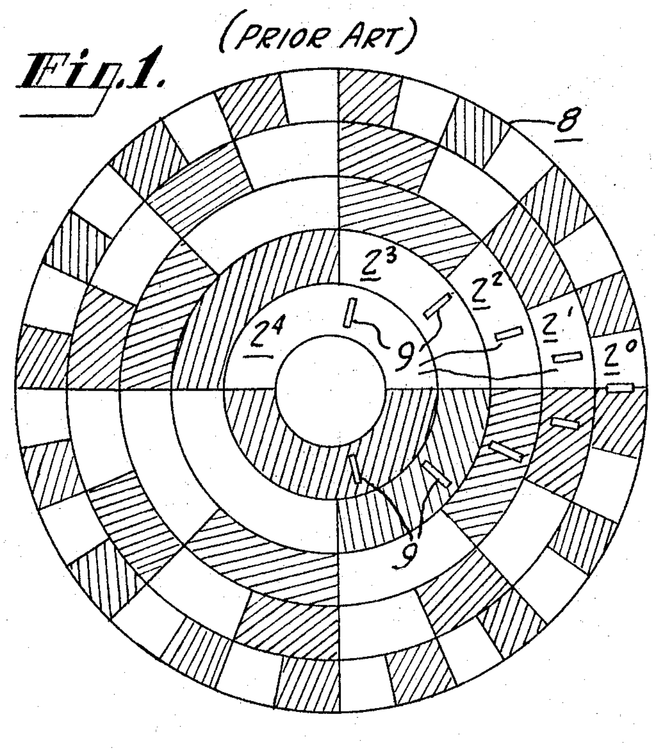
FIG. 1.
| Sensors 11 | Sensors 12 | Sensors 13 | Sensors 14 | "OR" GATE OUTPUT |
|---|---|---|---|---|
| 1 | | 0 | | 0 |
| | 1 | | 0 | 0 |
| 0 | | 1 | | 0 |
| | 0 | | 1 | 0 |
| 1 | | 1 | | 1 |
| | 1 | | 1 | 1 |
| 0 | | 0 | | 1 |
| | 0 | | 0 | 1 |
FIG. 6.
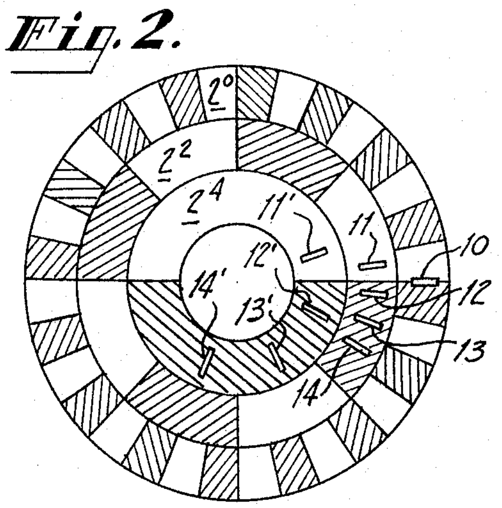
FIG. 2.
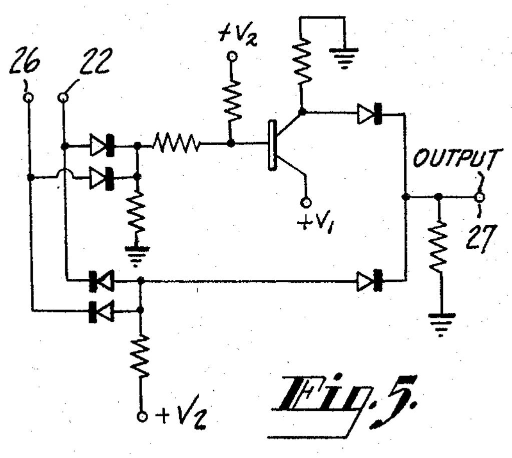
FIG. 5.
INVENTORS
DANIEL J. COYLE &
EARL D. GRIM, JR.
BY Carl V. Olson
Attorney

ANALOG-TO-DIGITAL CONVERTER

Filed March 18, 1963 3 Sheets-Sheet 2

INVENTORS
DANIEL J. COYLE &
EARL D. GRIM, JR.
BY Carl V. Olson
ATTORNEY

ANALOG-TO-DIGITAL CONVERTER

Filed March 18, 1963 3 Sheets-Sheet 3

INVENTORS
DANIEL J. COYLE &
EARL D. GRIM, JR.
BY Carl V. Olsen
Attorney

United States Patent Office 3,268,885
Patented August 23, 1966

3,268,885

ANALOG-TO-DIGITAL CONVERTER

Daniel J. Coyle and Earl D. Grim, Jr., Cherry Hill, N.J., assignors to Radio Corporation of America, a corporation of Delaware Filed Mar. 18, 1963, Ser. No. 265,697
3 Claims. (Cl. 340—347)

This invention relates to converters for converting a mechanical position, such as the position of a rotatable shaft, to a corresponding electrical indication in digital form.

Analog-to-digital shaft encoders commonly employ a code wheel having a number of segmented concentric code tracks equal to the number of digits desired in the output electrical signal. The code wheel is fixed on the shaft for rotation relative to stationary sensors each associated with a respective one of the tracks. The concentric arrangement of tracks may require the use of a code wheel having a larger outside diameter than is desired for reasons of compactness.

It is an object of this invention to provide an improved analog-to-digital converter employing fewer than one code track per output digit.

It is another object to provide an improved analog-to-digital shaft encoder having a smaller outside diameter than can be obtained in comparable prior art arrangements.

In accordance with an example of the invention, an analog-to-digital shaft encoder is constructed with a code wheel having a $2^0$ code track and a $2^2$ code track, the $2^1$ code track being omitted. A $2^0$ sensor is mounted to respond to the $2^0$ code track, and a plurality of $2^2$ sensors are mounted to respond to the $2^2$ code track. Electrical means are provided which are responsive to the $2^0$ sensor and are operative to selectively energize the plurality of $2^2$ sensors. Additionally, electrical means is provided which respond to the selectively energized $2^2$ sensors and is operative to generate a $2^2$ output signal and also a $2^1$ output signal. The arrangement can be similarly extended in an arrangement wherein the number of code tracks required is one more than half the desired number of output digits. The reduction of the number of concentric code wheel tracks results in a desired corresponding reduction in the outside diameter of the code wheel.

In the drawing:

FIG. 1 is a diagram of a prior art code wheel having five segmented code tracks rotatable relative to a plurality of sensors for the generation of five output digits;

FIG. 2 is a diagram of a code wheel according to the invention having only three code tracks rotatable relative to a plurality of sensors for the generation of five output digits;

FIG. 5 is a circuit diagram of an exclusive "or" gate suitable for use in the system of FIG. 3;

FIG. 6 is a chart of the logic function performed by the exclusive "or" gate of FIG. 5.

Figure 3:
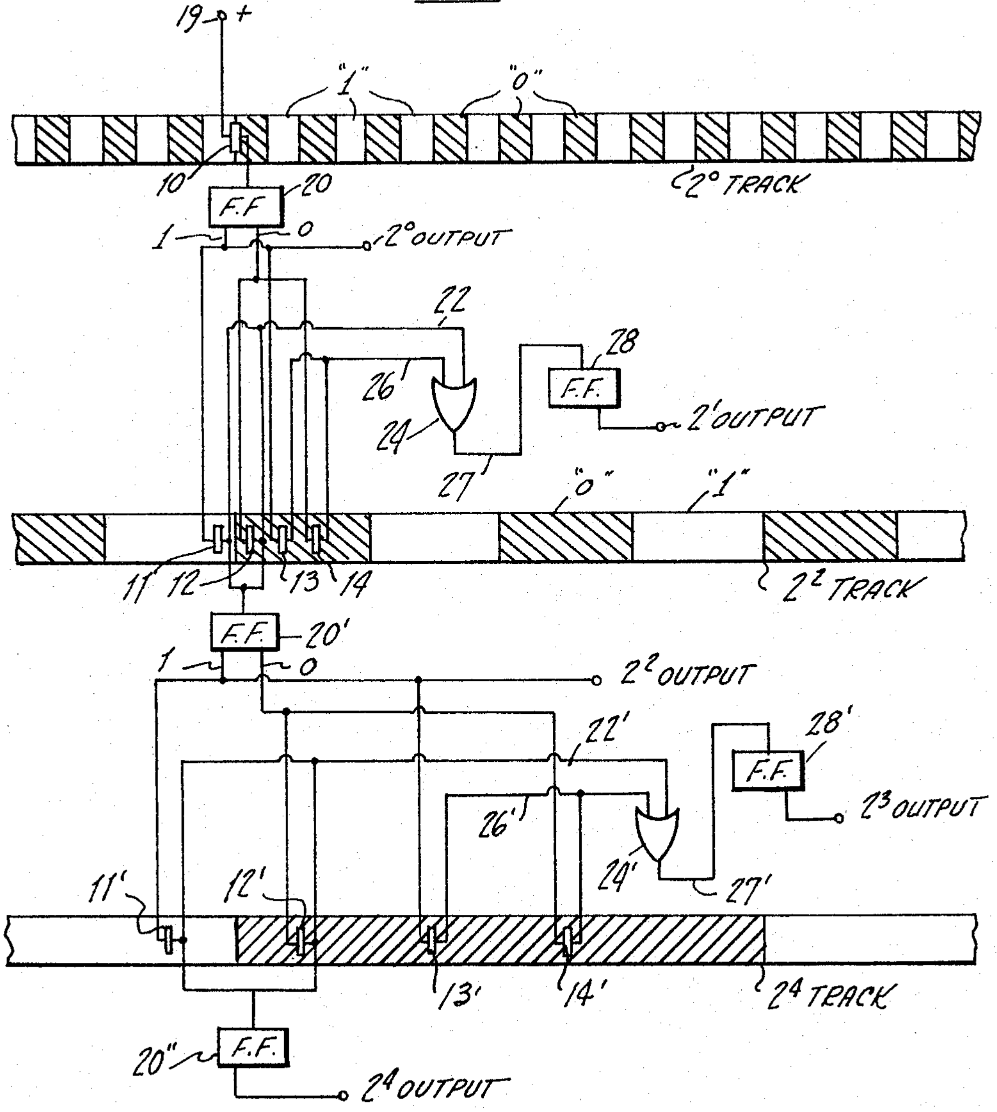
FIG. 3 is a diagram of an analog-to-digital encoder system constructed according to the teachings of the invention, the tracks of the code wheel of FIG. 2 being shown separated and straightened out for purposes of clarity of illustration.

Reference is now made in greater detail to the drawing. FIG. 1 shows a prior art code wheel 8 for use in an analog-to-digital shaft encoder system. The code wheel shown has five code tracks designated $2^0$, $2^1$, $2^2$, $2^3$ and $2^4$ which are segmented in accordance with the conventional binary digital code. The shaded and unshaded segments may be conductive and non-conductive segments, or may be transparent and opaque segments. A plurality of sensors 9 are positioned in the usual "V-scan" configuration with relation to the code tracks. The sensors 9 may be electrical brushes in an electrical system or may be electro-optical devices in the electro-optical system.

FIG. 2 shows a code wheel used in practicing the invention for comparison with the equivalent code wheel of the prior art shown in FIG. 1. The code wheel in FIG. 2 has only three code tracks $2^0$, $2^2$ and $2^4$. The $2^1$ and $2^3$ code tracks are omitted. The code wheel is preferably an optical wheel wherein the clear or transparent segments represent "1" and the shaded or opaque segments represent "0." The $2^0$ track provides the least significant bit and has associated with it a single sensor 10. The $2^2$ code track has associated with it four sensors 11, 12, 13 and 14 which are spaced apart from each other an amount equal to the angular width of one of the $2^0$ segments. The sensors 11 and 12 are equidistant from an angular radial reference line going through the sensor 10. The $2^4$ code track has associated with it sensors 11′, 12′, 13′ and 14′ which are spaced apart from each other an amount equal to the angular width of one of the $2^2$ segments. The sensors 11′ and 12′ are equidistant from the radial reference line going through sensor 10.

Another way to define the locations of the $2^2$ sensors is to say that the sensors 11 and 12 are located at points which are one-eighth of the width of a $2^2$ track segment on either side of the radial reference line going through sensor 10, and sensors 13 and 14 are located at points which are three-eighths and five-eighths, respectively, of the width of a $2^2$ track segment on one side of the radial reference line going through the sensor 10. The same definitions apply to the locations of the sensors 11′, 12′, 13′ and 14′ with relation to the $2^4$ track segment.

In constructing a code wheel and sensors according to the geometry of FIG. 2 in a small compact size, the close physical spacing of the sensors, particularly the sensors 10, 11, 12, 13 and 14, may present practical difficulties. These difficulties can be overcome by taking advantage of the cyclic nature of the code track patterns. The sensor 11 can be located at a corresponding point opposite any of the clear segments of the $2^2$ track, and the sensors 12, 13 and 14 can be located at corresponding points opposite different respective ones of the opaque segments of the $2^2$ track.

Stated another way, the sensor 11 can be located one-eighth of the width of a $2^2$ track segment on one side of the radial reference line going through sensor 10 or another radial reference line displaced an even multiple of $2^2$ track segment widths from the first-mentioned reference line, and the sensors 12, 13 and 14 can be located one-eighth, three-eighths and five-eighths of a $2^2$ track segment, respectively, on the other side of the same one or different ones of said radial reference lines. In this way, the sensors can be distributed within the area of the code wheel so that they are sufficiently separated from each other to simplify the practical problem of mounting the sensors.

The sensors 10, 11, 12, 13, 14, 11′, 12′, 13′ and 14′ are preferably photosensors (photo-sensitive elements) such as photodiodes or photoresistors which present a low impedance to the flow of current therethrough when they are illuminated through the code wheel by a continuous light source or sources (not shown) located on the other side of the code wheel. Light from a source reaches a sensor whenever a transparent segment of the code wheel is between the light source and the sensor.

FIG. 3 shows the system including the code wheel tracks and the sensors shown in FIG. 2, and also the electronics associated with the sensors. In FIG. 3, the code tracks $2^0$, $2^2$ and $2^4$ are separated and straightened out for purposes of clearly illustrating the geometrical and electrical relationships. The input terminal of the sensor 10 is connected to a positive terminal 19 of a source of direct current. The output terminal of the sensor 10 is connected to the signal input flip-flop circuit 20. The "1" output of flip-flop 20 is connected to the $2^0$ output terminal of the converter, and is connected to the input terminals of the sensors 11 and 13. The "0" or complement output of flip-flop 20 is connected to the input terminals of the sensors 12 and 14. The output terminals of sensors 11 and 12 are connected together to the input of a flip-flop 20' having a "1" output connected to the $2^2$ output terminal of the converter. The output terminals of sensors 11 and 12 are also connected together to one input 22 of an exclusive "or" gate 24. The output terminals of sensors 13 and 14 are connected together to the other input 26 of the exclusive "or" gate 24. The output of the exclusive "or" gate 24 is connected to the input of a flip-flop 28, which has an output connected to the $2^1$ output terminal of the converter.

Sensors 11', 12', 13' and 14' are located with relation to the $2^4$ track in the same manner in which sensors 11, 12, 13 and 14 are located with relation to the $2^2$ track. The electronic circuitry associated with the sensors of the $2^4$ track is the same as, and corresponding parts bear the same numerals with prime designations added, the electronics associated with the sensors of the $2^2$ tracks. All of the sensors remain stationary in the position shown, and the code tracks move in unison relative to the stationary sensors.

Figure 4:
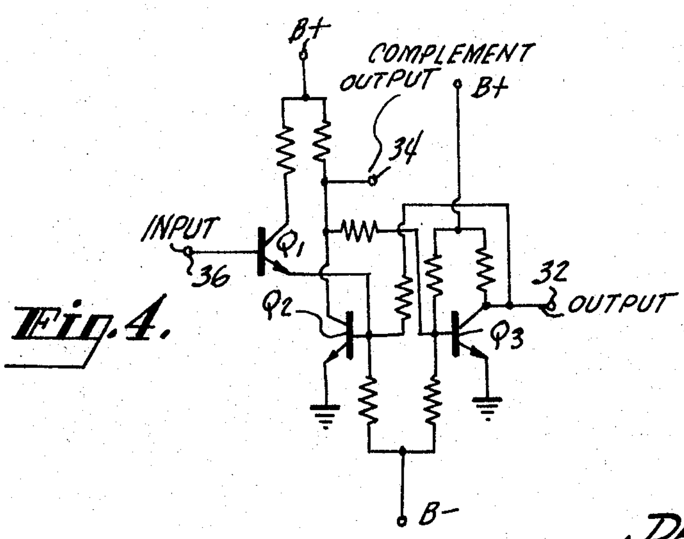
FIG. 4 is a circuit diagram of a flip-flop suitable for use in the system of FIG. 3.

FIG. 4 shows a flip-flop circuit which is suitable for use as the flip-flops 20, 28, 20', 28' and 20'' in the system of FIG. 3. The flip-flop of FIG. 4 includes transistors $Q_1$ and $Q_2$ which are biased to be normally nonconducting, and a transistor $Q_3$ which is biased to be normally conducting. A "0" output signal is normally present at the output terminal 32, and a "1" output signal is normally present at the complement output terminal 34. An input terminal 36 connected to a sensor receives a positive input signal when the sensor is both electrically energized and illuminated by light passing through a code track from a light source. The input signal causes the transistors $Q_1$ and $Q_2$ to become conductive, and causes the transistor $Q_3$ to become nonconductive, so that a "1" signal is provided at output terminal 32 and a "0" signal is provided at the complement output terminal 34. When the input signal is removed by removal of electrical energization or illumination from the sensor, the flip-flop circuit of FIG. 4 returns to its normal condition.

FIG. 5 shows an exclusive "or" circuit suitable for use as the circuits 24 and 24' in the system of FIG. 3. The exclusive "or" circuit of FIG. 5 is conventional and it performs the logic function illustrated in the chart of FIG. 6. The arrangement of FIG. 3 is such that sensors 11 and 13 are electrically energized when sensor 10 is illuminated and sensors 12 and 14 are electrically energized when sensor 10 is not illuminated. The chart of FIG. 6 defines the exclusive "or" function as one wherein a "1" output is provided solely when the inputs from sensors 11 and 13 are different (or when the inputs from sensors 12 and 14 are different).

Figure 7:
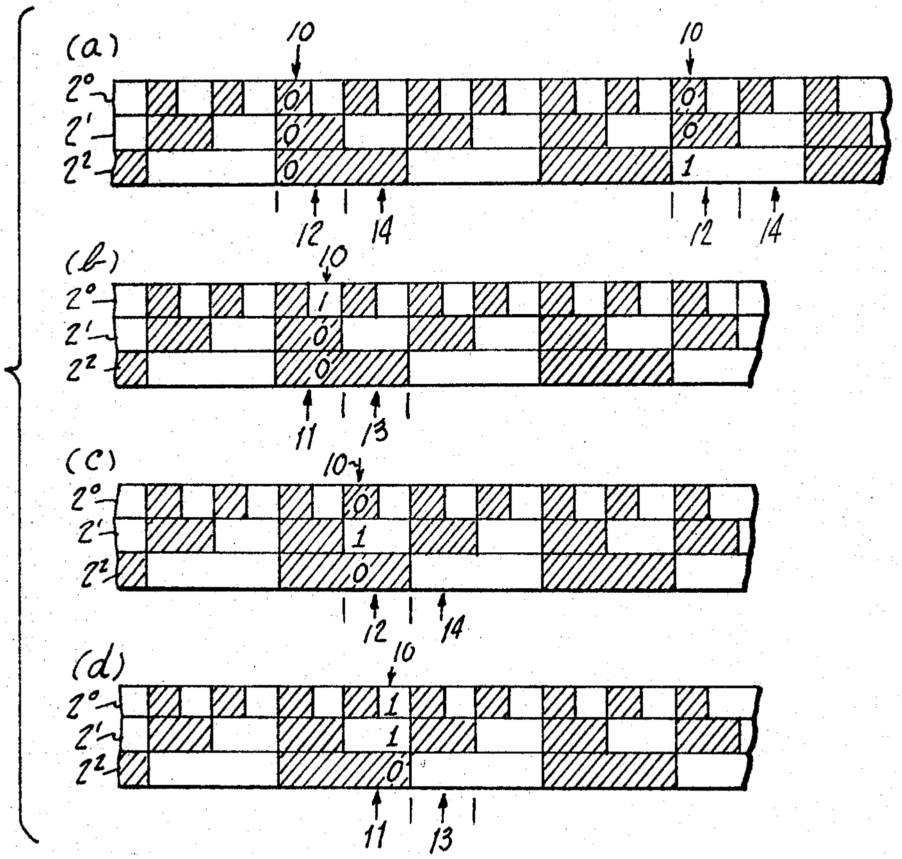
FIG. 7 is a series of diagrams which will be referred to in describing the operation of the system of FIG. 3.

In the operation of the system of FIG. 3, the sensor 10 is energized electrically from the positive terminal 19. The position of the code tracks with relation to the sensors are shown in FIG. 3 at the transition between a digital output indication of 00000 and 11111. For the purpose of describing the generation of the $2^0$, $2^1$, and the $2^2$ outputs of the system of FIG. 3, reference will be made also to the geometrical charts of FIG. 7, which show the $2^0$ and $2^2$ tracks, and which also show an intermediate $2^1$ track that is absent from the arrangement of FIG. 3.

The left part of FIG. 7*a* illustrates the condition when sensor 10 is blocked from receiving light through the $2^0$ code track. Under this condition, current does not flow from the positive terminal 19 through the sensor 10 to the input of flip-flop 20. Therefore, flip-flop 20 is in its normal state and provides an output from its "0" or complement output terminal which electrically energizes sensors 12 and 14. The positions of sensors 12 and 14 are shown in FIG. 7*a* to be such that code track $2^2$ blocks light from reaching sensors 12 and 14. Thus, no signal is supplied from sensor 12 to flip-flop 20' and the $2^2$ output therefrom is "0." The absence of signals, or the "0" outputs, from the sensors 12 and 14 are applied over leads 22 and 26 to the exclusive "or" gate 24. Since the input signals to the "or" gate 24 are the same, the output from gate 24 (via flip-flop 28) to the $2^1$ output terminal is "0." The $2^1$ output signal is "0," as it should be, as can be seen from intermediate $2^1$ code track representation included for reference in FIG. 7*a*, but absent from the system of FIG. 3. It is thus seen that the electronic logic circuitry in this position of the code wheel in conjunction with the geometry of the sensors provides a $2^1$ output signal even though the $2^1$ track is not present in the system of FIG. 3.

FIG. 7*b* illustrates the relationship of the sensors and code tracks after one unit of relative displacement between the tracks and sensors. The sensor 10 is in a position to receive light through the $2^0$ track so that it acts through flip-flop 20 to electrically energize sensors 11 and 13. Sensors 11 and 13 are still blocked from receiving light so that they act through flip-flop 20' to provide a "0" output at the $2^2$ output terminal. Since both sensors 11 and 13 are blocked, the exclusive "or" gate 24 provides no output and the $2^1$ output terminal supplies a "0."

FIG. 7*c* illustrates the relationships after yet another unit displacement. The sensor 10 is blocked from receiving light and flip-flop 20 causes electrical energization of sensors 12 and 14. Sensor 12 is blocked from receiving light so that it causes flip-flop 20' to supply the proper "0" signal to the $2^2$ output terminal. Since only one of the sensors 12 and 14 receives light, the exclusive "or" gate supplies a "1" output to the $2^1$ output terminal. FIG. 7*d* and the right-hand portion of FIG. 7*a* illustrate the conditions after two respective additional units of displacement.

The operation of the system in providing $2^0$, $2^1$ and $2^2$ outputs from sensors on solely a $2^0$ track and a $2^2$ track may be summarized as follows:

When the $2^0$ sensor is blocked from receiving light and indicates a "0," it causes electrical energization of sensors 12 and 14 on the $2^2$ track. The sensor 12 provides a $2^2$ output. If sensor 12 only or sensor 14 only is illuminated, the $2^1$ output is a "1"; otherwise the $2^1$ output is a "0."

When the $2^0$ sensor is illuminated and indicates a "1," it causes electrical energization of sensors 11 and 13 on the $2^2$ track. The sensor 11 provides the $2^2$ output. If sensor 11 only or sensor 13 only is illuminated, the $2^1$ output is a "1"; otherwise the $2^1$ output is a "0."

Having described how a $2^1$ output signal is obtained from sensors on the $2^0$ and $2^2$ tracks, it remains to be noted that the same scheme is followed in obtaining a $2^3$ output from sensors on the $2^2$ and $2^4$ tracks. The arrangement can be extended to provide for as many output digits as are desired. The number of tracks needed is one more than half the number of output digits desired.

In the generation of the $2^2$ output signal from sensors 11 and 12, sensor 11 is energized and provides the $2^2$ output if sensor 10 on the $2^0$ track is illuminated, and sensor 12 is energized and provides the $2^2$ output if sensor 10 on the $2^0$ track is not illuminated. Therefore, the arrangement possesses the advantage of so-called "V-scan"

arrangements in avoiding ambiguity in the output signals. The sensor 10 in making transitions between transparent and opaque segments on the $2^0$ code track controls the timing of transitions of sensors on the $2^2$ code track. This removes the necessity for an impractically perfect radial alignment of code wheel tracks and sensors. The system also incorporates the V-scan feature in the generation of all the other output digit signals.

What is claimed is:

1. An analog-to-digital converter, comprising
a $2^0$ track having equal and alternating clear and opaque segments,
a $2^2$ track having equal and alternating clear and opaque segments, each of said $2^2$ track segments being angularly coextensive with four contiguous segments of said $2^0$ track,
a $2^0$ photosensor associated with said $2^0$ track and located on an angular reference line,
first, second, third and fourth $2^2$ photosensors associated with said $2^2$ track, said four photosensors being spaced apart from each other an amount equal to the angular width of one of said $2^0$ segments, said first and second photosensors being equidistant from said angular reference line,
light source means positioned to direct light through said tracks to said photosensors,
means to electrically energize said $2^0$ photosensor,
a flip-flop responsive to said $2^0$ photosensor and providing a $2^0$ output which is also connected to electrically energize said first and third $2^2$ photosensors and providing a complement output connected to electrically energize said second and fourth $2^2$ photosensors,
an exclusive "or" gate having an input responsive to said first and second photosensors, having another input responsive to said third and fourth photosensors and providing a $2^1$ output, and
means responsive to either one of said first and second photosensors to provide a $2^2$ output.

2. An analog-to-digital converter, comprising
a $2^0$ track having equal and alternating transmitting and blocking segments,
a $2^2$ track having equal and alternating transmitting and blocking segments, each of said $2^2$ track segments being angularly coextensive with four contiguous segments of said $2^0$ track,
a $2^0$ sensor associated with said $2^0$ track and located on a radial reference line,
first, second, third and fourth $2^2$ sensors associated with said $2^2$ track, each of said four sensors being located with reference to said radial reference line or a radial reference line displaced an even multiple of $2^2$ track segments, therefrom, said first $2^2$ sensor being located one-eighth of a $2^2$ track segment width on one side of a radial reference line, said second, third and fourth $2^2$ sensors being located respectively at one-eighth, three-eighths and five-eighths of a $2^2$ track segment width on the other sides of radial reference lines,
energy source means positioned to direct energy through transmitting segments of said tracks to said sensors,
means to electrically energize said $2^0$ sensor, a flop-flop responsive to said $2^0$ sensor and having a $2^0$ output also connected to electrically energize said first and third $2^2$ sensors and having a complement output connected to electrically energize said second and fourth $2^2$ sensors,
an exclusive "or" gate having an input responsive to said first and second sensors, having another input responsive to said third and fourth sensors and having a $2^1$ output, and
means responsive to either one of said first and second sensors to provide a $2^2$ output.

3. An analog-to-digital converter, comprising
a $2^0$ track having equal and alternating clear and opaque segments,
a $2^2$ track having equal and alternating clear and opaque segments, each of said $2^2$ segments being angularly coextensive with four contiguous segments of said $2^0$ track,
a $2^0$ photoresistor sensor associated with said $2^0$ track and located on a radial reference line,
first, second, third and fourth $2^2$ photoresistor sensors associated with said $2^2$ track, each of said four photoresistor sensors being located with reference to said radial reference line or a radial reference line displaced an even multiple of $2^2$ track segments therefrom, said first $2^2$ sensor being located one-eighth of a $2^2$ track segment width on one side of a radial reference line, said second, third and fourth $2^2$ sensors being located respectively at one-eighth, three-eighths and five-eights of a $2^2$ track segment width on the other sides of radial reference lines,
light source means positioned to direct light through said tracks to said sensors,
means to electrically energize said $2^0$ sensor,
a flip-flop responsive to said $2^0$ sensor and having a $2^0$ output also connected to electrically energize said first and third $2^2$ sensors and having a complement output connected to electrically energize said second and fourth $2^2$ sensors,
an exclusive "or" gate having an input responsive to said first and second sensors, having another input responsive to said third and fourth sensors and having a $2^1$ output, and
means responsive to either one of said first and second sensors to provide a $2^2$ output.

References Cited by the Examiner

UNITED STATES PATENTS

| | | | |
|---|---|---|---|
| 2,975,409 | 3/1961 | Petherick | 340—347 |
| 3,020,534 | 2/1962 | Jones | 340—347 |
| 3,175,210 | 3/1965 | Wolinsky | 340—347 |

OTHER REFERENCES

Stupar: 10-Bit Resolution in Shaft-Position to Digital Encoder, in Electrical Manufacturing, pp. 138–141, January 1959. (Copy in Scientific Library.)

MAYNARD R. WILBUR, *Primary Examiner.*

DARYL W. COOK, *Examiner.*

A. L. NEWMAN, L. W. MASSEY, *Assistant Examiners.*